US008637987B2

(12) United States Patent
Chong et al.

(10) Patent No.: US 8,637,987 B2
(45) Date of Patent: Jan. 28, 2014

(54) SEMICONDUCTOR ASSEMBLIES WITH MULTI-LEVEL SUBSTRATES AND ASSOCIATED METHODS OF MANUFACTURING

(75) Inventors: Chin Hui Chong, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 13/206,321

(22) Filed: Aug. 9, 2011

(65) Prior Publication Data

US 2013/0037949 A1   Feb. 14, 2013

(51) Int. Cl.
*H01L 23/48* (2006.01)
*H01L 23/52* (2006.01)
*H01L 29/40* (2006.01)

(52) U.S. Cl.
USPC ........................................................ 257/758

(58) Field of Classification Search
USPC ........................................................ 257/758
See application file for complete search history.

(56) References Cited

U.S. PATENT DOCUMENTS

| 6,430,058 | B1 | 8/2002 | Sankman et al. | |
|---|---|---|---|---|
| 7,091,622 | B2 * | 8/2006 | Kinsman et al. | 257/782 |
| 2001/0010090 | A1 | 7/2001 | Boyle et al. | |
| 2005/0253284 | A1 * | 11/2005 | Wang et al. | 257/787 |
| 2006/0027919 | A1 | 2/2006 | Ali et al. | |
| 2006/0113653 | A1 | 6/2006 | Xiaoqi et al. | |
| 2007/0094631 | A1 | 4/2007 | Galatenko et al. | |
| 2007/0228577 | A1 | 10/2007 | Corisis et al. | |

* cited by examiner

*Primary Examiner* — Jenny L Wagner
(74) *Attorney, Agent, or Firm* — Perkins Coie LLP

(57) ABSTRACT

Various embodiments of semiconductor assemblies with multi-level substrates and associated methods of manufacturing are described below. In one embodiment, a substrate for carrying a semiconductor die includes a first routing level, a second routing level, and a conductive via between the first and second routing levels. The conductive via has a first end proximate the first routing level and a second end proximate the second routing level. The first routing level includes a terminal and a first trace between the terminal and the first end of the conductive via. The second routing level includes a second trace between the second end of the conductive via and a ball site. The terminal of the first routing level and the ball site of the second routing level are both accessible for electrical connections from the same side of the substrate.

17 Claims, 9 Drawing Sheets

US 8,637,987 B2

SEMICONDUCTOR ASSEMBLIES WITH MULTI-LEVEL SUBSTRATES AND ASSOCIATED METHODS OF MANUFACTURING

TECHNICAL FIELD

The present disclosure is related to semiconductor assemblies with multi-level substrates and associated methods of manufacturing.

BACKGROUND

Board-on-chip ("BOC") techniques have been used for packaging high speed memory components. FIG. 1A is a cross-sectional view of a BOC semiconductor assembly in accordance with the prior art. As shown in FIG. 1A, the semiconductor assembly 100 includes a substrate 102, a semiconductor die 104 attached to the substrate 102 with an adhesive 106, and an encapsulant 108 encapsulating the semiconductor die 104 and at least a portion of the substrate 102. The substrate 102 includes a first side 102a proximate the semiconductor die 104, a second side 102b opposite the first side 102a, and an opening 118 between the first and second sides 102a and 102b. The opening 118 exposes a connection region 110 on the semiconductor die 104. A plurality of traces 112 are located on the second side 102b of the substrate 102 and are electrically connected to the connection region 110 via a plurality of wirebonds 114. A plurality of electrical couplers 116 (e.g., solder balls) are attached to ball sites on the substrate 102.

FIG. 1B is a bottom view of the semiconductor assembly 100 of FIG. 1A, and FIG. 1C is an enlarged view of a portion of the semiconductor assembly 100 shown in FIG. 1B. As shown in FIGS. 1B and 1C, the semiconductor die 104 can include a plurality of bond sites 119 in the connection region 110. The individual bond sites 119 are coupled to corresponding terminals 113 of the individual traces 112 on the semiconductor substrate 102 via the wirebonds 114. As is clearly shown in FIGS. 1B and 1C, the plurality of traces 112 fan out from the terminals 113 to contact corresponding ball pads 120.

Over the course of time, manufacturers have made dies smaller and smaller to meet user demands. As the semiconductor dies 104 have become smaller, the number of ball pads 120 and the traces 112 required on the substrate 102 has increased such that the large ball pads 120 can interfere with routes of the traces 112. One conventional solution for dealing with this problem is to use aggressive design rules and wire bond profiles to decrease the sizes of all features on both the semiconductor die 102 and the substrate 104. However, such a conventional technique is still limited due to the number of ball pads 120 that are typically required.

BRIEF DESCRIPTION OF THE DRAWINGS

FIG. 1B is a bottom view of the BOC semiconductor assembly of FIG. 1A.

FIG. 1C is an enlarged view of the BOC shown in FIG. 1B.

DETAILED DESCRIPTION

Various embodiments of semiconductor assemblies with multi-level substrates and associated methods of manufacturing are described below. Typical semiconductor assemblies or packages include microelectronic circuits or components, thin-film recording heads, data storage elements, microfluidic devices, and other components manufactured on microelectronic substrates. Substrates can include semiconductor pieces (e.g., doped silicon wafers or gallium arsenide wafers), non-conductive pieces (e.g., various ceramic substrates), or conductive pieces. A person skilled in the relevant art will also understand that the technology may have additional embodiments, and that the technology may be practiced without several of the details of the embodiments described below with reference to FIGS. 2A-6.

Figure 1A:
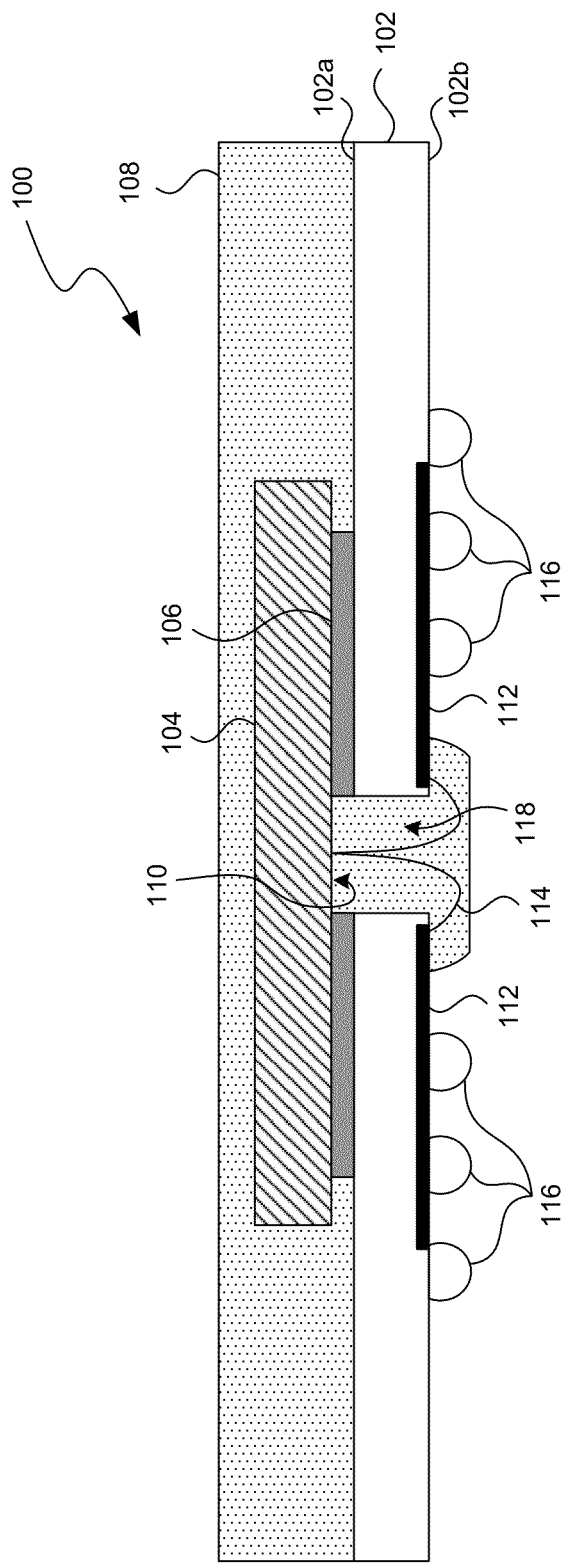
FIG. 1A illustrates a BOC semiconductor assembly in accordance with the prior art.
Figure 2A:
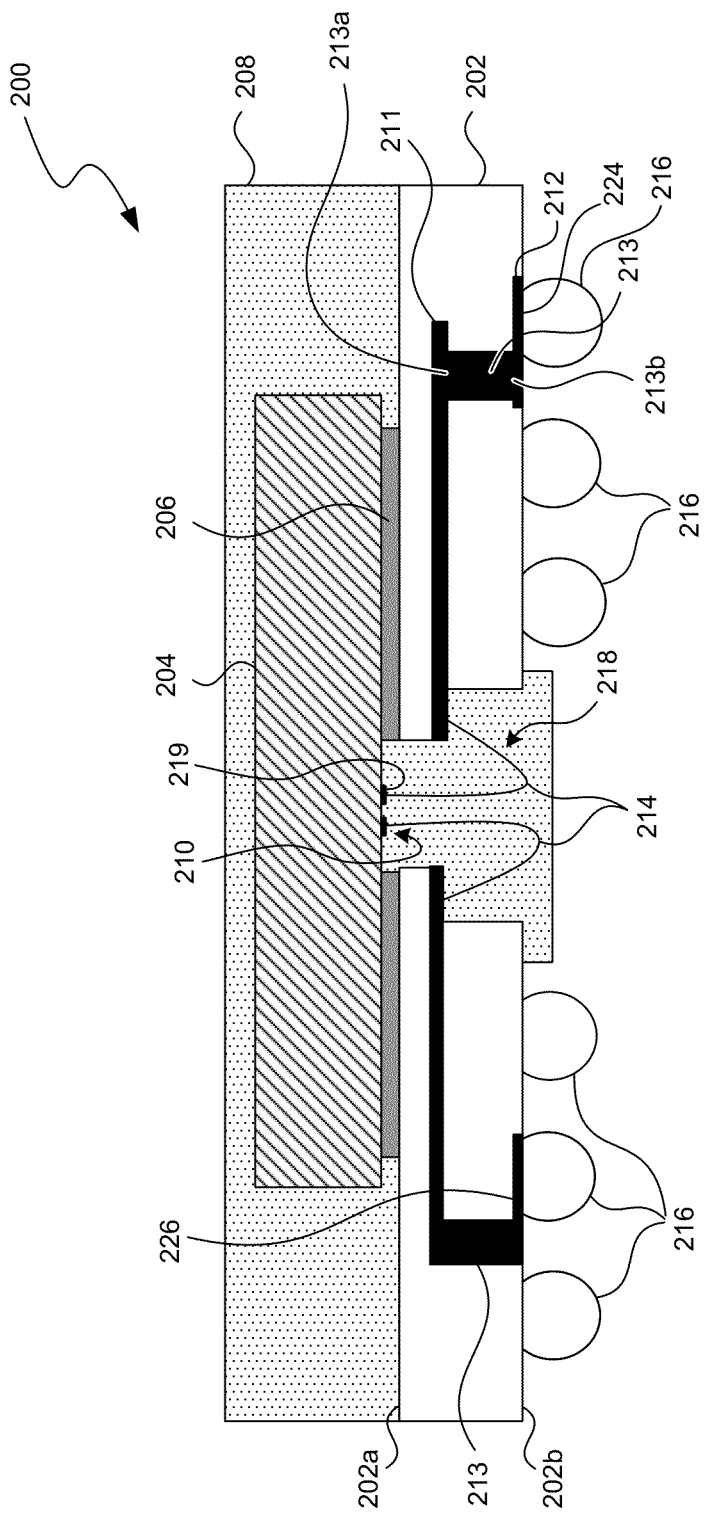
FIG. 2A illustrates a BOC semiconductor assembly with a multi-level substrate in accordance with embodiments of the present technology.

FIG. 2A illustrates a BOC semiconductor assembly 200 with a multi-level substrate 202 configured in accordance with embodiments of the present technology. As shown in FIG. 2A, the semiconductor assembly 200 can include the multi-level substrate 202, a semiconductor die 204 attached to the substrate 202 with an adhesive 206, and an encapsulant 208 encapsulating the semiconductor die 204 and at least a portion of the substrate 202. The semiconductor die 204 can include a memory die, a processor, and/or other suitable types of dies. The encapsulant 208 can include an epoxy and/or other suitable compositions. Even though a particular arrangement of the foregoing components is shown in FIG. 2A for illustration purposes, in other embodiments, the semiconductor die 204 may also be attached to the substrate 202 in a flip-chip configuration and/or other suitable configurations.

In the illustrated embodiment, the substrate 202 can include a first side 202a proximate the semiconductor die 204, a second side 202b opposite the first side 202a, and an opening 218 extending through the substrate 202 from the first side 202a to the second side 202b. The opening 218 exposes a connection region 210 on the semiconductor die 204. The connection region includes bond sites 219 that are connected internally to structures within the semiconductor die 204. In other embodiments, the opening 218 may be omitted, for example, if the semiconductor die 204 is coupled to the substrate 202 in a flip-chip configuration.

As shown in FIG. 2A, the substrate 202 includes a first routing level 211, a second routing level 212, and conductive vias 213 between the first and second routing levels 211 and 212. The individual first and second routing levels 211 and 212 can be in generally parallel planes, and can include a trace, a plate, and/or other suitable routing structures. Individual conductive vias 213 can include a first end 213a in contact with the first routing level 211 and a second end 213b in contact with the second routing level 212. In the illustrated embodiment, a plurality of wirebonds 214 electrically connect individual bond sites 219 at the connection area 210 of the semiconductor die 204 to the first routing level 211. In other embodiments, at least some of the wirebonds 214 can also be connected to the second routing level 212, as described in more detail below with reference to FIG. 4A. In further embodiments, the substrate 202 may include three, four, or any other suitable number of routing levels in configurations generally similar to or different from that shown in FIG. 2A, depending upon the embodiment. In any of these embodiments, the second ends 213b of the individual vias 213 can be electrically connected to individual ball sites 224 via connectors 226. The ball sites 224 can be configured as a ball grid array to receive a plurality of electrical couplers 216 (e.g., solder balls) as shown in FIG. 2A.

Figure 2B:
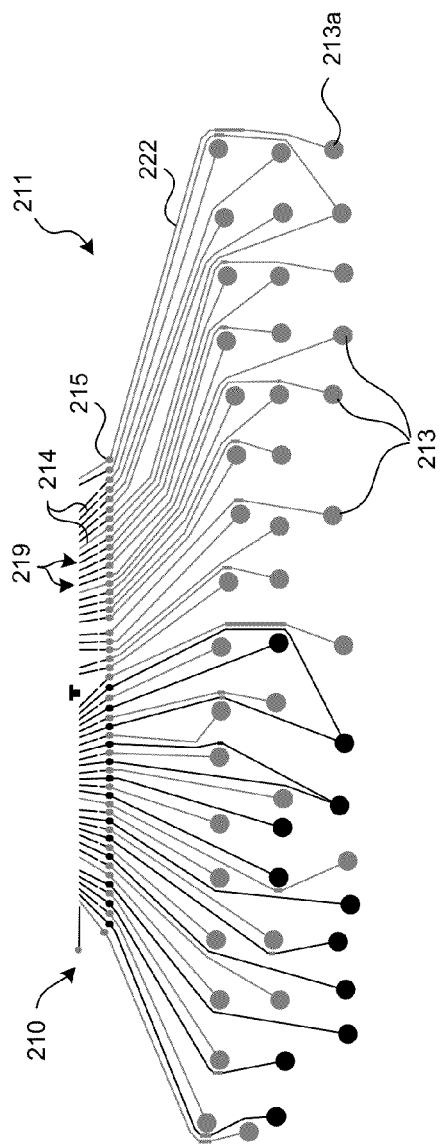
FIGS. 2B and 2C are plan views of first and second substrate levels, respectively, of the multi-level substrate shown in FIG. 2A.
Figure 2C:
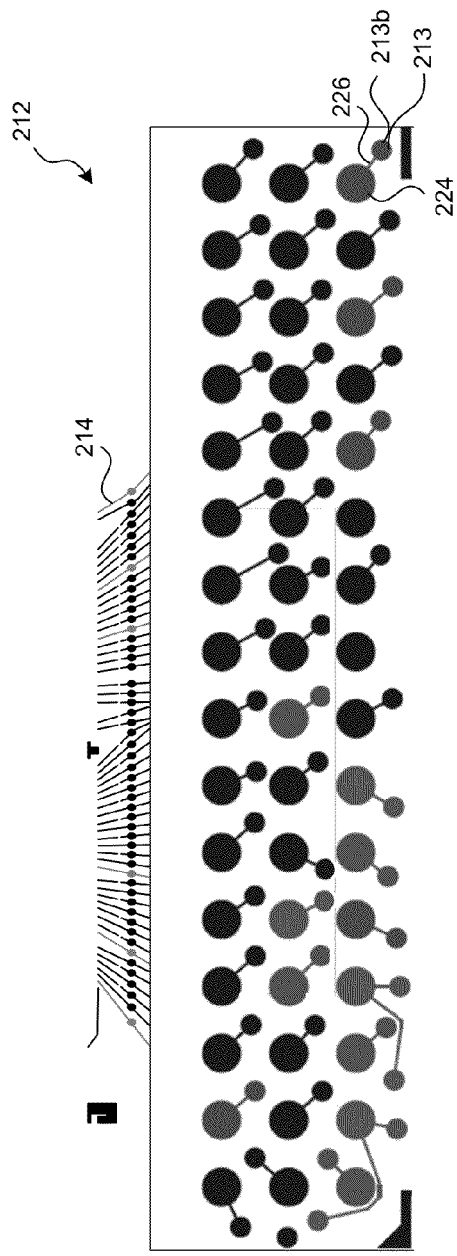

FIGS. 2B and 2C are bottom views of the first and second routing levels 211 and 212, respectively. As shown in FIG. 2B, the individual wirebonds 214 are electrically coupled between a terminal 215 of the individual trace 222 on the first routing level 211 and corresponding bond sites 219 in the connection region 210. The individual traces 222 fan out from the terminals 215 to connect with the first ends 213a of the conductive vias 213. As shown in FIG. 2C, the second routing level 212 includes the second ends 213b of the individual vias 213, which are electrically connected to corresponding ball sites 224 with corresponding connectors 226, as discussed above with reference to FIG. 2A. The bond sites 219 (FIG. 2B) and the ball sites 224 (FIG. 2A) can be accessible from the same side (e.g., the same major surface) of the substrate 202, as shown in FIG. 2A. As a result, and with continued reference to FIG. 2A, the wire bonds 214 and electrical couplers 216 (e.g., solder balls) can readily be connected to the substrate 202 from the same side of the substrate 202.

As shown in FIGS. 2B and 2C, the first routing level 211 of the substrate 202 has a plurality of traces 222 that fan out to form a target pattern of the first ends 213a of the conductive vias 213. The illustrated first routing level 211 does not include any ball sites. As a result, the traces 222 can fan out without hindrance from the ball sites 224 because the ball sites 224 are on the second routing level 212 which is in a different plane than the plane containing the traces 222. In other words, the traces 222 on the first routing level 211 can pass under or over any number of ball sites 224 without interference from the ball sites 224 because the ball sites 224 are on the second routing level 212. As a result, embodiments of the substrate 202 can accommodate a large number of traces 222 and ball sites 224 even though the semiconductor die 204 has a small size.

Figure 3A:
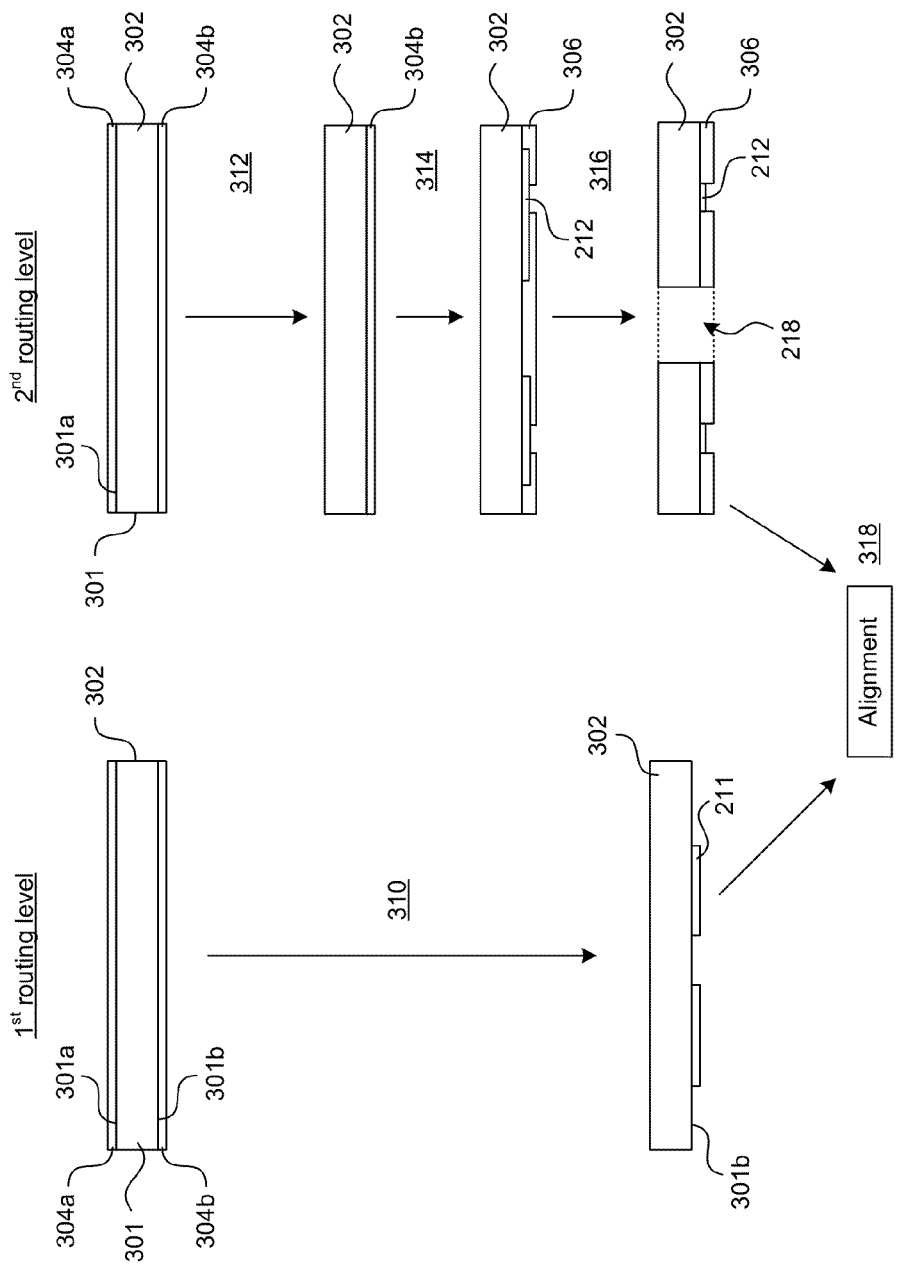
FIGS. 3A and 3B illustrate a process of forming the multi-level substrate shown in FIG. 2A, in accordance with embodiments of the technology.
Figure 3B:
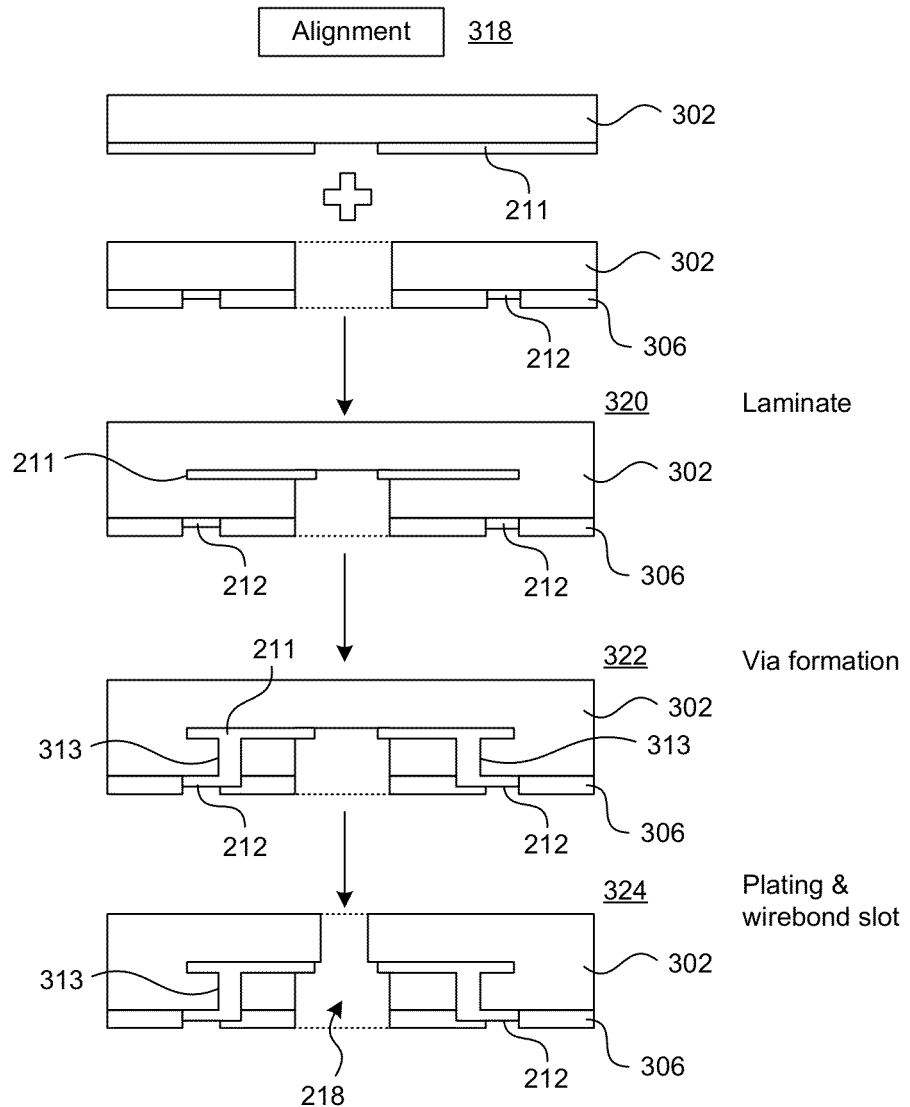

FIGS. 3A and 3B illustrate a process of forming the multilevel substrate 202 in FIG. 2A in accordance with embodiments of the technology. As shown in FIG. 3A, the process for forming the first routing level 211 and the second routing level 212 are shown side by side for illustration purposes. In certain embodiments these processing stages may be performed concurrently. In other embodiments these operating stages may be performed at least partially in series.

As shown in FIG. 3A, separate pieces or elements of a substrate material 302 are used to form the first and second routing levels, respectively. The substrate material 302 includes a generally non-conductive core 301 with a first conductive material 304a (e.g. copper) on a first side 301a and a second conductive material 304b on a second side 301b. An initial stage 310 of forming the first routing level 211 can include stripping the first conductive material 304a from the first side 301a of the non-conductive core 301. Subsequently, the second conductive material 304b may be patterned and selectively removed from the second side 301b of the non-conductive core 301, forming the first routing level 211.

Preparing the second routing level 202 can include stripping the first conductive material 304a from the first side 301a of a separate non-conductive core 301 (stage 312) and patterning and selectively removing the second conductive material 304b to form a targeted pattern for the second routing level 212 (stage 314). As shown in FIG. 3A, a solder mask 306 is formed over the second routing level 212 at stage 316. In other embodiments the solder mask 306 may be omitted. Stage 316 can include removing a portion of the solder mask 306 and the generally non-conductive core 301 to form a portion of the opening 218 in the substrate 202. The formed first and second routing levels 211 and 212 can then be generally aligned at stage 318.

As shown in FIG. 3B, the first routing level 211 and the second routing level 212 can be laminated together at stage 320. Conductive vias 313 between the first and second routing levels 211 and 212 can be subsequently formed at stage 322 using through-substrate via forming techniques and/or other suitable techniques. Subsequently, the non-conductive core 301 of the first routing level 211 can be selectively removed to form another portion of the opening 218 in the substrate 202 at stage 324. Subsequently, the semiconductor die 204 (FIG. 2A) can be attached to the substrate 202 and subsequently encapsulated with encapsulant 218 according to conventional techniques for BOC packaging.

Figure 4A:
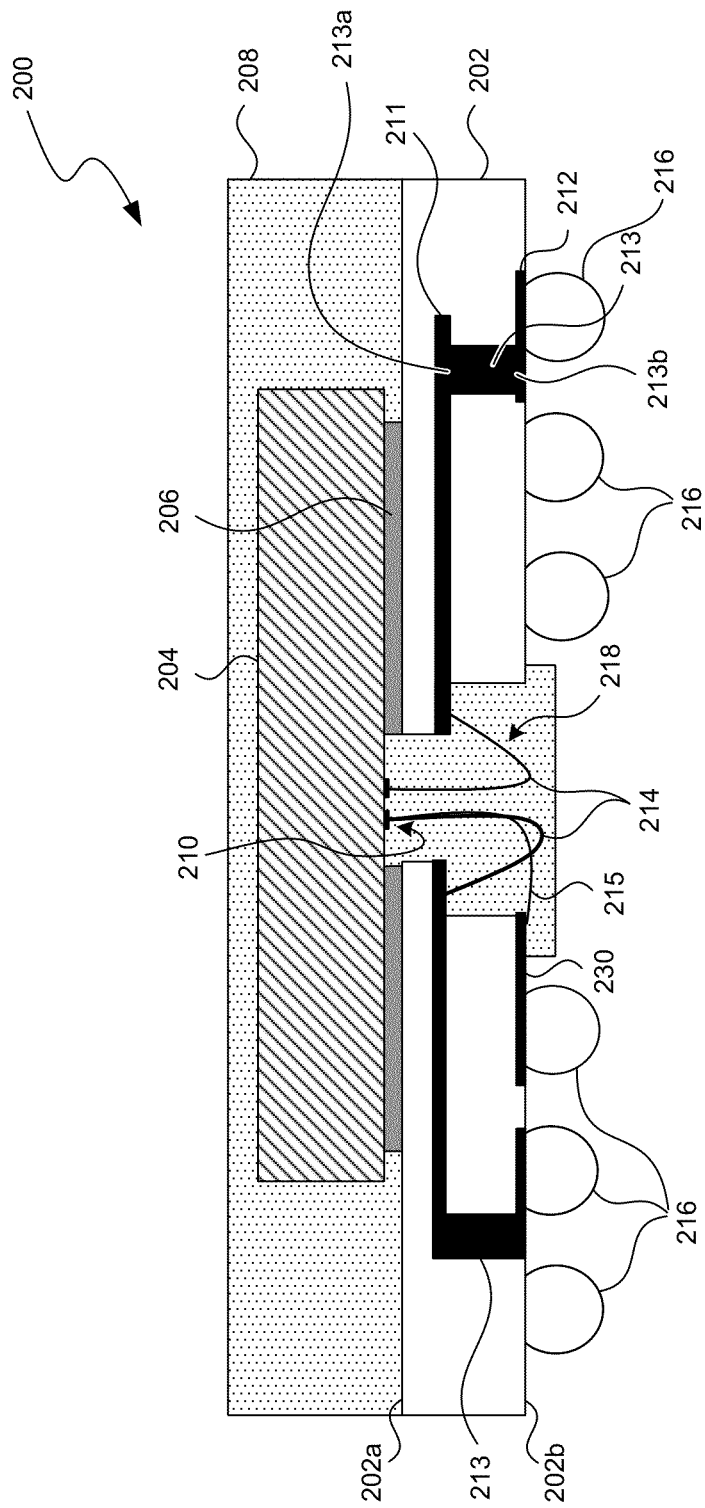
FIG. 4A illustrates a BOC semiconductor assembly with a multi-level substrate in accordance with additional embodiments of the present technology.

Even though the wirebonds 214 are shown in FIG. 2A as extending between the connection region 210 of the semiconductor die 204 and the first routing level 211, in other embodiments the second routing level 212 can also include contact areas electrically coupled to the connection region 210 of the semiconductor die 204. For example, as shown in FIG. 4A, the second routing level 212 can include at least one contact area 230 electrically coupled to the connection region 210 of the semiconductor die 204 via a wirebond 215.

Figure 4B:
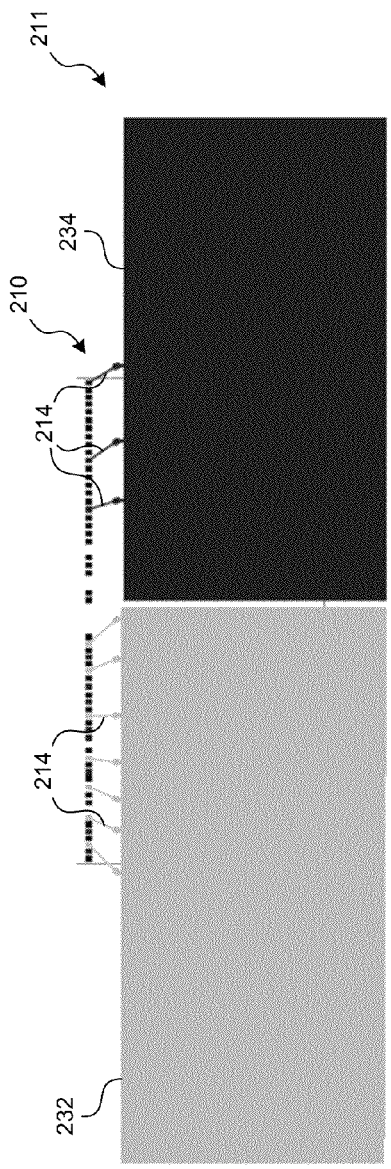
FIGS. 4B and 4C are plan views of first and second substrate levels of the multi-level substrate shown in FIG. 4A.
Figure 4C:
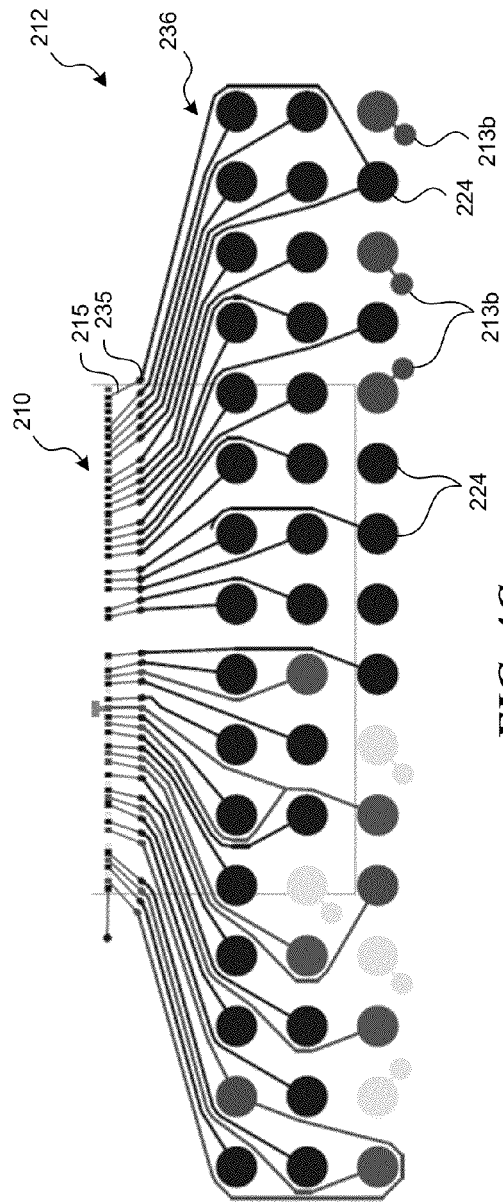

As shown in FIG. 4B, the first routing level 211 is shown divided into a first signal plane 232 and a second signal plane 234 in a side-by-side arrangement. The individual first and second signal planes 232 and 234 are electrically coupled to the connection region 210 with the wirebonds 214. In certain embodiments, at least one of the first and second signal planes 232, 234 can include a power plane, a ground plane, and/or other suitable signal planes that are electrically common to multiple terminals of the die 204 (FIG. 4A). As shown in FIG. 4C, the second routing level 212 can include a plurality of traces 236 that fan out from a plurality of terminals 235 into a plurality of ball sites 224. The individual terminals 235 are electrically connected to the connection region 210 via the wirebonds 215. The first and second routing levels 211 and 212 are connected with the conductive vias 213, in a manner generally similar to that discussed above with reference to FIGS. 2A-2C.

Figure 5:
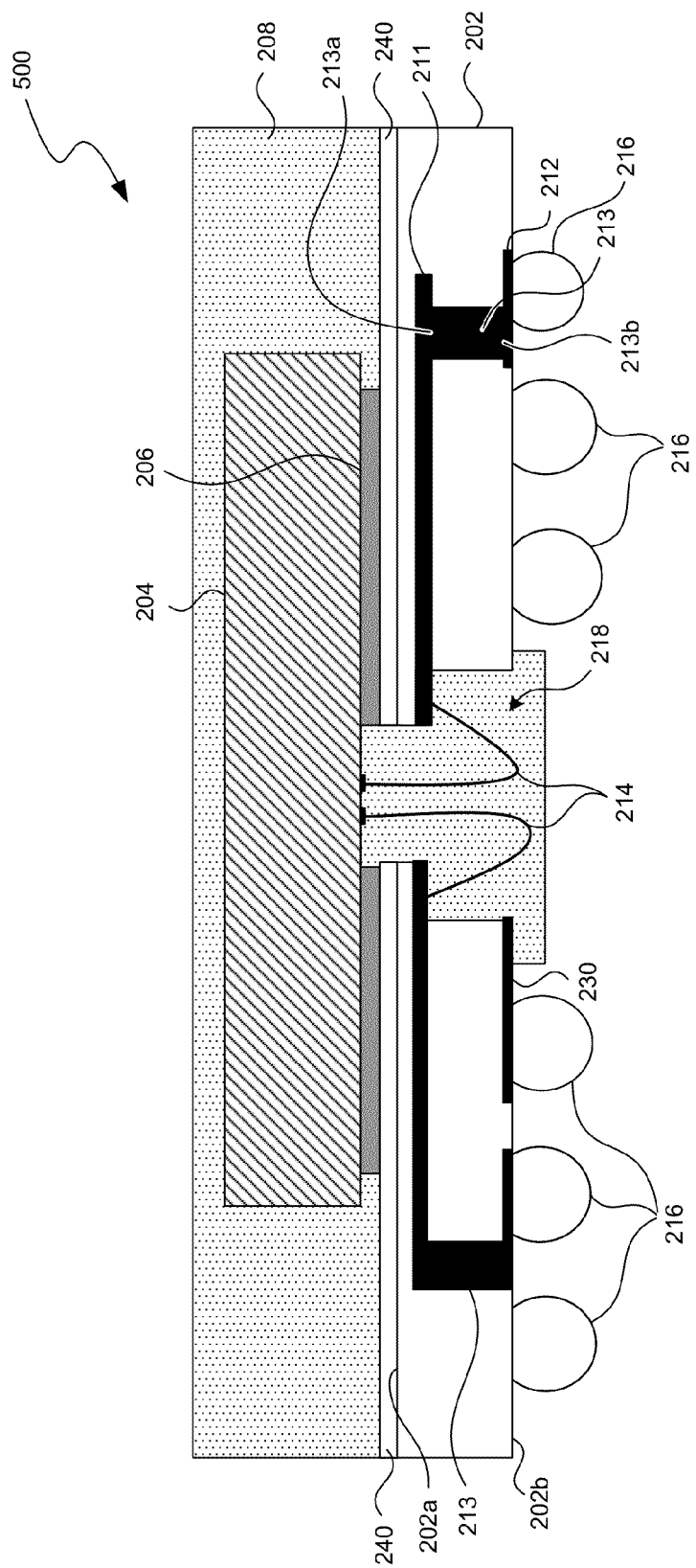
FIGS. 5 and 6 illustrate BOC semiconductor assemblies with a multi-level substrate in accordance with further embodiments of the present technology.
Figure 6:
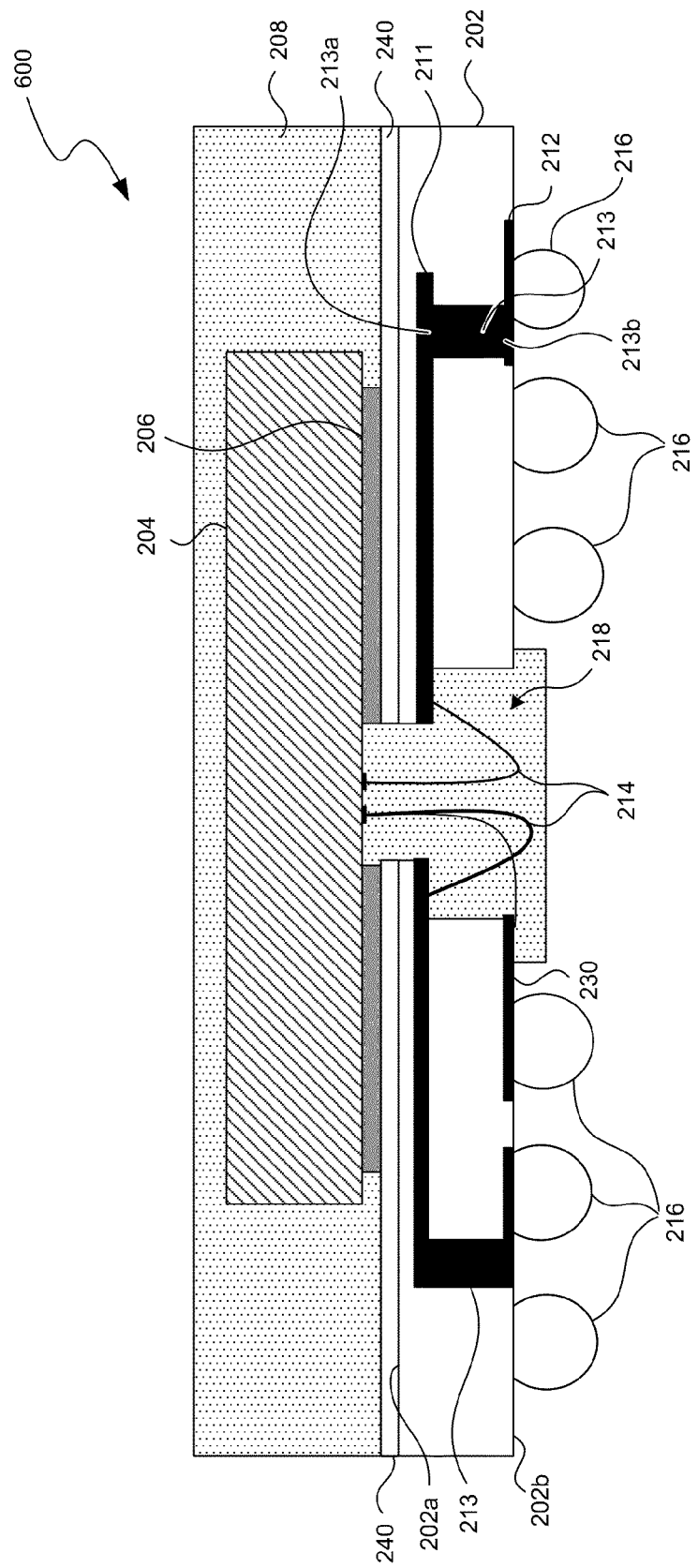

FIGS. 5 and 6 are cross-sectional views of BOC semiconductor assemblies 500 and 600, respectively, configured in accordance with additional embodiments of the present technology. Embodiments of the semiconductor assemblies 500 and 600 can be generally similar to those shown in FIGS. 2A and 4A, respectively, except that the semiconductor assemblies 500 and 600 individually include a conductive material 240 between the substrate 202 and the semiconductor die 204. The conductive material 240 can include a metal plate, a metal alloy plate, and/or other suitable materials and/or structures with sufficient thermal conductivity to conduct heat from the semiconductor die 202. In further embodiments, the conductive material 240 may be replaced with other suitable heat conducting components (e.g., Peltier elements) or may be omitted.

One feature of several of the foregoing embodiments is that the traces and the ball sites to which they connect can be located on different levels or strata of the substrate. This arrangement allows the designer greater flexibility when selecting the routes for the traces and the locations for the ball sites because the routes can follow paths that are independent of the ball site locations, so long as individual routes can be connected to the corresponding ball sites with vias, as described above. Another feature of at least some embodiments is that the ball sites on one level of the substrate and portions of the traces on another level of the substrate are both accessible from the same side or face of the substrate. This arrangement allows the manufacturer to access the traces for wirebonding and access the ball sites for depositing solder balls or other electrical couplers with the substrate facing the same direction.

From the foregoing, it will be appreciated that specific embodiments of the technology have been described herein for purposes of illustration, but that various modifications may be made without deviating from the technology. For example, in an embodiment shown in FIG. 3A, the two routing levels are initially formed on separate non-conductive cores, which are then joined. As part of this process, the conductive material on one side of each core is removed. In other embodiments, portions of this conductive material can remain, e.g., to carry out additional routing functions. The traces and ball pads can have arrangements different than those specifically illustrated in the foregoing Figures. The materials described in the context of particular embodiments above can have different constituents and/or properties in other embodiments.

Certain aspects of the technology described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the disclosure and associated technology can encompass other embodiments not expressly shown or described herein.

We claim:

1. A semiconductor assembly, comprising:
   a semiconductor die having a bond site in a connection region;
   a substrate carrying the semiconductor die, the substrate including—
      a first non-conductive core,
      a second non-conductive core,
      a first routing level disposed between the first and second non-conductive cores,
      a second routing level spaced apart from first routing level by the second non-conductive core, and
      a conductive via between the first and second routing levels, the conductive via extending through the second non-conductive core and having a first end proximate the first routing level and a second end proximate the second routing level,
   wherein—
      the first routing level includes a terminal and a first trace electrically connected between the terminal and the first end of the conductive via,
      the second routing level includes a second trace electrically connected between the second end of the conductive via and a ball site,
      the first non-conductive core is stacked relative to the second non-conductive core, and
      the first and second non-conductive cores have the same composition of material; and
   a wirebond extending between the bond site in the connection region of the semiconductor die and the terminal of the first routing level.

2. The semiconductor assembly of claim 1 wherein the first routing level does not include any ball sites.

3. The semiconductor assembly of claim 1, further comprising a solder ball attached to the ball site of the second routing level of the substrate.

4. The semiconductor assembly of claim 1 wherein the substrate includes an opening exposing the connection region, and wherein the wirebond extends through the opening to electrically connect the bond site in the connection region of the semiconductor die and the terminal of the first routing level.

5. The semiconductor assembly of claim 1 wherein:
   the terminal is a first terminal;
   the wirebond is a first wirebond;
   the bond site is a first bond site;
   the ball site is a first ball site;
   the second routing level also includes a second terminal and a third trace extending between the second terminal and a second ball site; and
   the semiconductor assembly further includes a second wirebond extending between a second bond site of the semiconductor die and the second terminal of the second routing level.

6. The semiconductor assembly of claim 1 wherein:
   the terminal is a first terminal;
   the wirebond is a first wirebond;
   the bond site is a first bond site;
   the ball site is a first ball site;
   the second routing level also includes a second terminal and a third trace extending between the second terminal and a second ball site;
   the semiconductor assembly further includes a second wirebond extending between a second bond site of the semiconductor die and the second terminal of the second routing level; and
   the first routing level includes at least one of a grounding plane and a power plane.

7. The semiconductor assembly of claim 1 wherein:
   the terminal is a first terminal;
   the wirebond is a first wirebond;
   the bond site is a first bond site;
   the ball site is a first ball site;
   the first routing level does not include any ball sites;
   the second routing level also includes a second terminal and a third trace extending between the second terminal and a second ball site;
   the semiconductor assembly further includes a second wirebond extending between a second bond site of the semiconductor die and the second terminal of the second routing level; and
   the first routing level includes at least one of a grounding plane and a power plane.

8. The semiconductor assembly of claim 1, further comprising a solder mask attached to the second conductive core, wherein the solder mask and the second non-conductive core have a different composition of material.

9. The semiconductor assembly of claim 8 wherein each of the first and second non-conductive cores has a corresponding aperture extending therethrough, the apertures being aligned with each other, and wherein the wirebond extends through both apertures.

10. The semiconductor assembly of claim 1, further comprising a solder mask attached to the second non-conductive core, wherein the solder mask and the second non-conductive core are composed of different materials.

11. The semiconductor assembly of claim 1 further comprising a conductive material between the first non-conductive core and the semiconductor die.

12. A semiconductor assembly, comprising:
a semiconductor die;
a first non-conductive core;
a conductive material disposed between the semiconductor die and the first non-conductive core;
a second non-conductive core having a first side and a second side opposite the first side, wherein a portion of the first non-conductive core is attached to the first side of the second non-conductive core;
a first routing layer attached to the first side of the second non-conductive core;
a second routing layer attached to the second side of the second non-conductive core; and
a conductive via extending through the second non-conductive core and electrically connected between the first and second routing levels, the conductive via having a first end proximate the first routing level and a second end proximate the second routing level, wherein—
the first routing level includes a terminal and a first trace between the terminal and the first end of the conductive via,
the second routing level includes a second trace between the second end of the conductive via and a ball site, and
the terminal of the first routing level and the ball site of the second routing level are both accessible for electrical connections from the same side of the substrate.

13. The semiconductor assembly of claim 12 wherein the conductive material is configured to conduct heat from the semiconductor die.

14. The semiconductor assembly of claim 12 wherein the conductive material is a first conductive material, and wherein the routing level includes a second conductive material that is bonded to the second non-conductive core.

15. The semiconductor assembly of claim 12, further comprising an opening extending entirely through the first and second non-conductive cores and accessible from opposite sides of the substrate.

16. The semiconductor assembly of claim 12, further comprising a wirebond connected to the terminal of the first routing level and a solder ball attached to the ball site of the second routing level, with the wirebond and the solder ball accessible from the same side of the substrate.

17. The semiconductor assembly of claim 12 wherein the substrate includes an opening that allows a wirebond to extend through the opening to be between a bond site at the semiconductor die and the terminal of the first routing level.

* * * * *